United States Patent
Kuo et al.

(10) Patent No.: US 6,388,913 B1
(45) Date of Patent: May 14, 2002

(54) METHOD FOR DETECTING POLARIZATION OF A FERROELECTRIC CAPACITOR IN A FERROELECTRIC MEMORY AND THEREOF STRUCTURE

(75) Inventors: Tung-Cheng Kuo, Yilan Hsien; Hsiang-Lan Lung, Hsinchu; Shue-Shuen Chen, Yunlin Hsien, all of (TW)

(73) Assignee: Macronix International Co., Ltd., Hsin-Chu (TW)

( * ) Notice: Subject to any disclaimer, the term of this patent is extended or adjusted under 35 U.S.C. 154(b) by 0 days.

(21) Appl. No.: 09/772,326

(22) Filed: Jan. 30, 2001

(30) Foreign Application Priority Data

Nov. 17, 2000 (TW) ........................................ 089124440

(51) Int. Cl.[7] .............................................. G11C 11/22
(52) U.S. Cl. ........................................ 365/145; 365/149
(58) Field of Search .................................. 365/145, 149

(56) References Cited

U.S. PATENT DOCUMENTS

| | | | | |
|---|---|---|---|---|
| 5,432,731 A | * | 7/1995 | Kirsch et al. | 365/149 |
| 5,487,030 A | * | 1/1996 | Drab et al. | 365/149 |
| 5,729,488 A | * | 3/1998 | Drab et al. | 365/145 |
| 6,172,897 B1 | * | 1/2001 | Shuto | 365/145 |
| 6,195,281 B1 | * | 2/2001 | Kim | 365/145 |

\* cited by examiner

*Primary Examiner*—Huan Hoang
(74) *Attorney, Agent, or Firm*—Powell Goldstein Frazer & Murphy LLP

(57) ABSTRACT

A method for detecting polarization of a ferroelectric capacitor in a ferroelectric memory and thereof structure is provided by detecting polarization of a ferroelectric capacitor through a characteristic which present different voltage values by providing different voltages on the ferroelectric capacitor stay at different polarization directions, so that the disadvantages caused by a conventional method for detecting charge quantity can be improved and a limited size of a capacitance of the cell ferroelectric capacitor can be solved. The method for detecting comprises the step of detecting an output voltage on a connection node between a cell ferroelectric capacitor and a sense linear capacitor, and then if the detected output voltage is high read voltage, a logic state of the cell ferroelectric capacitor is decided to a first logic state, if the detected output voltage is low read voltage, a logic state of the cell ferroelectric capacitor is decided to a second logic state.

9 Claims, 6 Drawing Sheets

METHOD FOR DETECTING POLARIZATION OF A FERROELECTRIC CAPACITOR IN A FERROELECTRIC MEMORY AND THEREOF STRUCTURE

FIELD OF THE INVENTION

The present invention relates to a method for detecting polarization of a ferroelectric capacitor in a ferroelectric memory and thereof structure, which detecting polarization of a ferroelectric capacitor through a characteristic which present different voltage values by providing different voltages on the ferroelectric capacitor stay at different polarization directions, so that the disadvantages caused by a conventional method for detecting charge quantity can be improved.

BACKGROUND OF THE INVENTION

Currently, electric memories can be split up into two types based on their functions, the one is random access memory (RAM) and the other is non-volatile read only memory (ROM). The differences between two types are the write speed and the function of memory. Because the electric memories cannot equip the above two functions simultaneity, so that the application of the electric memories have been limited. Therefore, many scientists and scholars make an effort to find a solvent. Thereupon, a ferroelectric film has a higher dielectric and a ferroelectric characteristic has been submitted to solve the above problems.

Referring to FIG. 1, it is a schematic view of a structure of a conventional non-volatile ferroelectric memory cell. As shown in FIG. 1, a conventional non-volatile ferroelectric memory cell 10 comprises an NMOS transistor 12 and a ferroelectric capacitor 14. The structure of FIG. 1 is similar to a DRAM 1T-1C structure, the difference is the dielectric layer of the capacitor in a DRAM cell is replaced by a ferroelectric material, so that the data can be written and measured through different polarization directions of the ferroelectric material.

FIGS. 2A~2D show schematic views of an operation principle of a conventional ferroelectric memory cell has 1T-1C structure.

When a voltage VDD is provided to the ferroelectric capacitor 14, the ferroelectric film of the ferroelectric capacitor 14 would be polarized and a polarization value Pr would be remained. Since the polarization value +Pr is decided as a logic "0", the −Pr is determined as a logic "1", as shown in FIG. 2A. When reading a data, a positive voltage pulse VDD can be provided to a memory cell, as shown in FIG. 2B. The decision includes two manners. The one is, detecting during a voltage pulse is imposed, so that the voltage values "1" and "0" on the bit line (BL) in proportion to polarization values, as shown in FIG. 2C. The other is, if the logic state of a cell is "0", the polarization of the ferroelectric film will be changed from Ps to Pr after a voltage pulse is imposed and a small current generated can be observed. On the other hand, if the logic state of a cell is "1", the polarization of the ferroelectric film will be changed from Ps to −Pr and a great current generated can be observed. Thus, the logic state of the cell can be derived via in comparison of the difference between the small current and the great current, as shown in FIG. 2D. In above two manners, a storage state of a primary data would be destructed because the issue of a voltage pulse must be provided to the ferroelectric capacitor 14, thus the above action is referred as a destructive read out (DRO). To refresh the storage state of the primary data of a memory cell, it is necessary for rewriting after reading.

That is, the conventional technology has been limited. For example, when the polarization of the ferroelectric capacitor is changed and the charge quantity is detected by using the DRO method, however, the charge quantity is related and limited to the size of the ferroelectric capacitor. But, in a writing case, the size of the ferroelectric capacitor cannot be too great.

SUMMARY OF THE INVENTION

The present invention provides a method for detecting polarization of a ferroelectric capacitor in a ferroelectric memory and thereof structure, which detecting polarization of a ferroelectric capacitor through a characteristic which present different voltage values by providing different voltages on the ferroelectric capacitor stay at different polarization directions, so that the disadvantages caused by a conventional method for detecting charge quantity can be improved, and a size limitation of the cell ferroelectric capacitor can be solved.

The present invention provides a method for detecting polarization of a ferroelectric capacitor in a ferroelectric memory, wherein the ferroelectric memory comprises a memory array, the memory array at least comprises a cell ferroelectric capacitor, the cell ferroelectric capacitor is connected in serial to a sense linear capacitor outside the memory array through a bit line and is received a read voltage $V_R$, the method comprising the steps of: at first, detecting an output voltage on a connection node between the cell ferroelectric capacitor and the sense linear capacitor. Then, if the detected output voltage is high read voltage, a logic state of the cell ferroelectric capacitor is decided to a first logic state. And, if the detected output voltage is low read voltage, a logic state of the cell ferroelectric capacitor is decided to a second logic state.

The present invention provides a structure of detecting polarization of a ferroelectric capacitor in a ferroelectric memory, the structure at least comprises a memory array and a sense linear capacitor. The memory array at least comprises a depletion mode NMOS transistor and a cell ferroelectric capacitor. The depletion mode NMOS transistor has a source terminal connected to a bit line and a gate terminal connected to a word line. The cell ferroelectric capacitor is connected in serial between a drain terminal of the depletion mode NMOS transistor and the word line. The sense linear capacitor is disposed outside the memory array and is connected in serial between an output terminal of the bit line and a sense voltage.

DETAILED DESCRIPTIONS OF THE INVENTION

The present invention discloses a method for detecting polarization of a ferroelectric capacitor in a ferroelectric memory by using a sense linear capacitor and thereof structures. The invention will be described in detail as below.

The invention provides a method of detecting a polarization of a ferroelectric capacitor through a characteristic that presents different voltage values by providing different voltages on the ferroelectric capacitor stay at different polarization direction.

Figure 1:
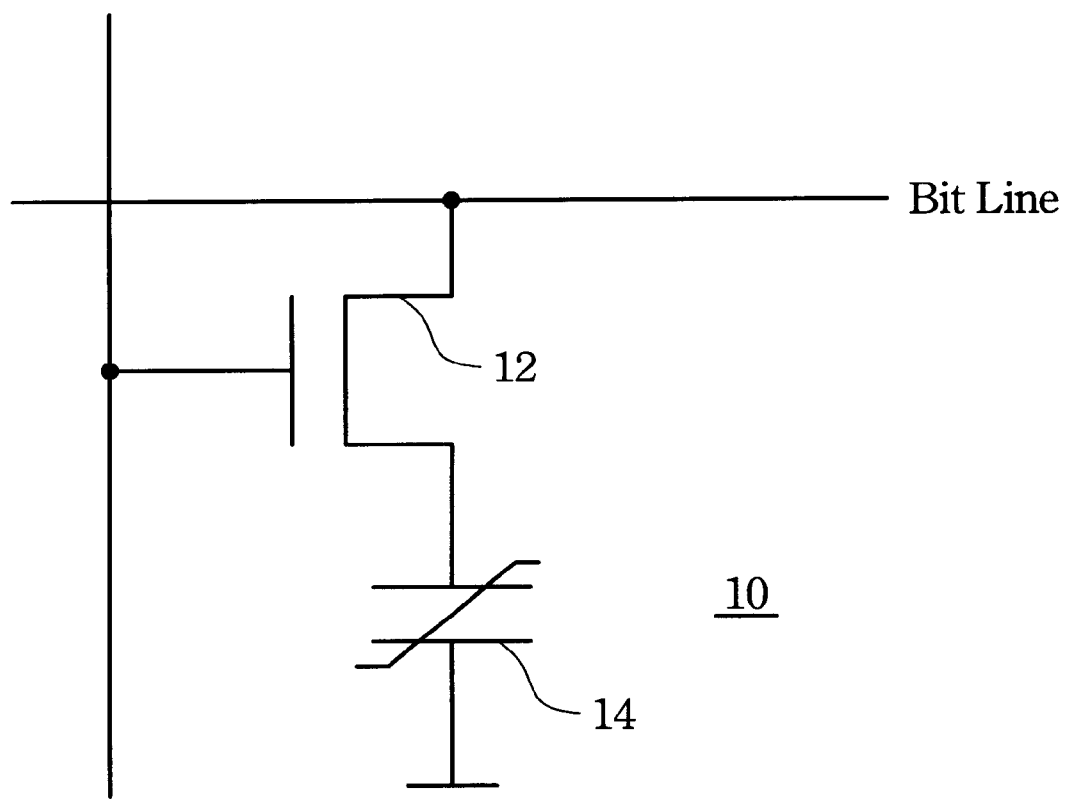
FIG. 1 shows a schematic view of a structure of a conventional non-volatile ferroelectric memory cell.
Figure 2A:
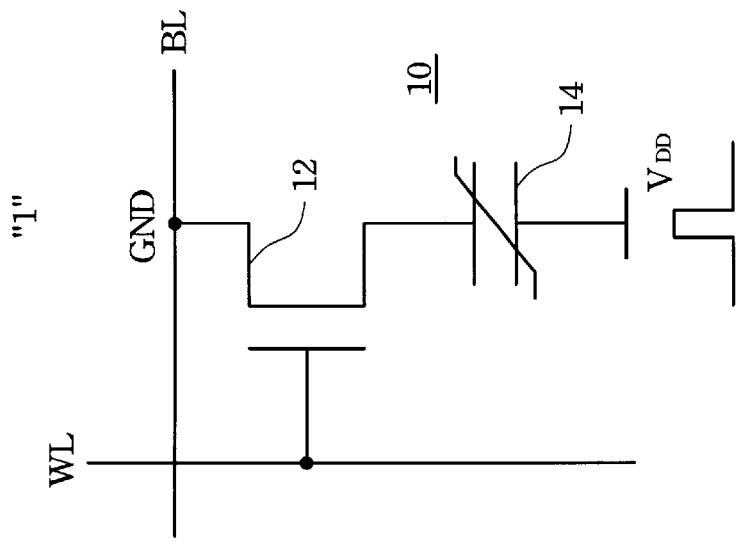
FIGS. 2A~2D show schematic views of an operation principle of a conventional ferroelectric memory cell has 1T-1C structure.
Figure 2A:
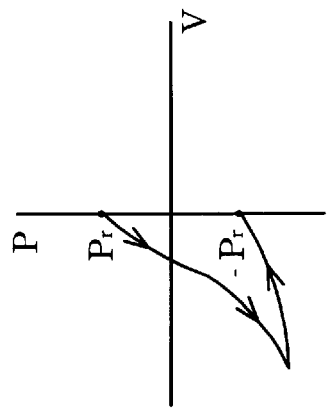
Figure 2A:
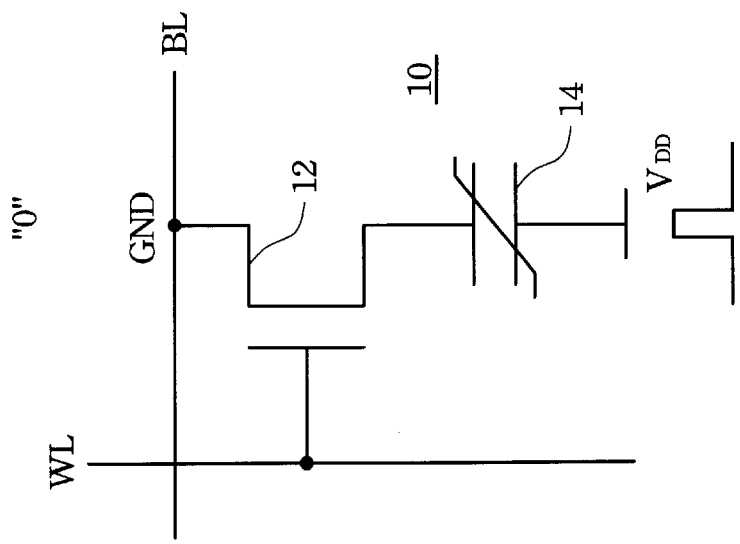
Figure 2A:
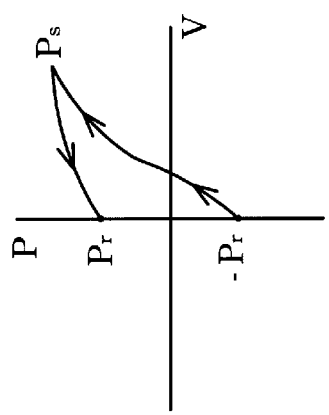
Figure 2C:
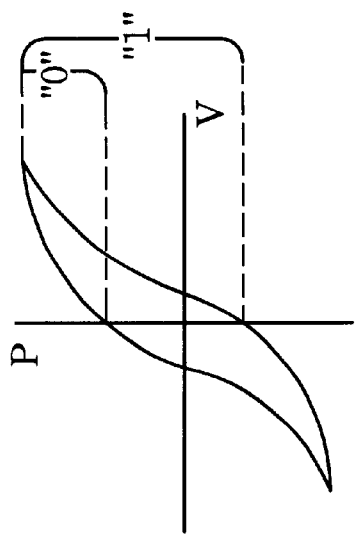
Figure 2D:
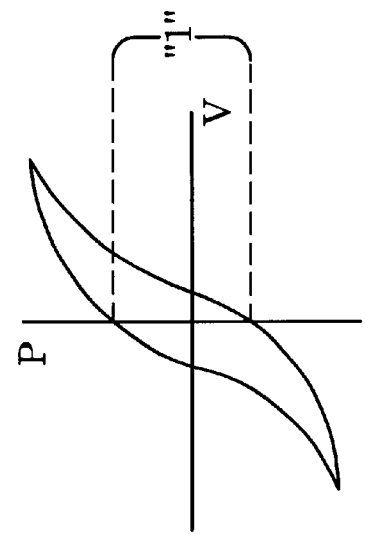
Figure 2B:
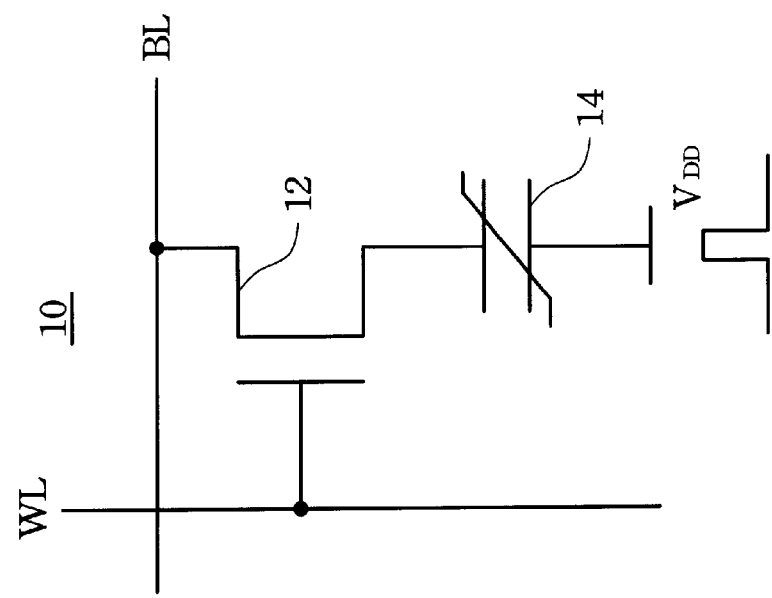
Figure 3B:
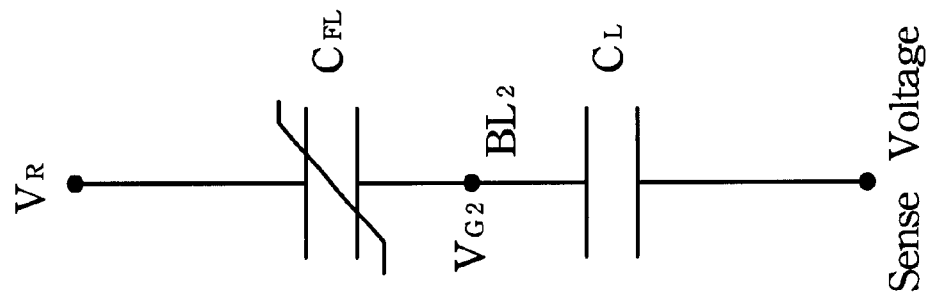
FIGS. 3A and 3B show schematic views of detecting polarization of a ferroelectric capacitor in a ferroelectric memory by using a sense linear capacitor of a preferred embodiment according to the present invention.
Figure 3A:
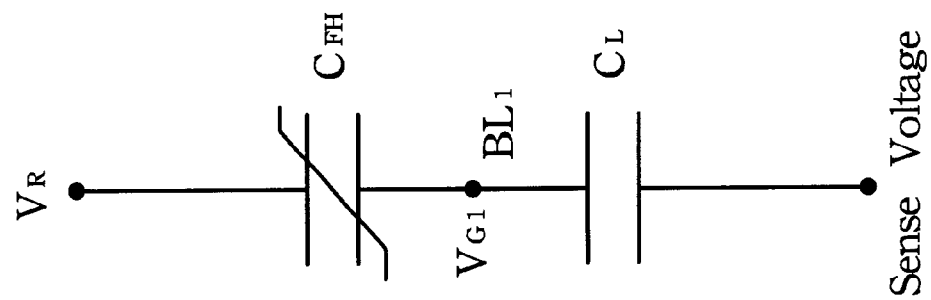

FIGS. 3A and 3B show schematic views of detecting polarization of a ferroelectric capacitor in a ferroelectric memory by using a sense linear capacitor of a preferred embodiment according to the present invention.

In FIGS. 3A and 3B, a ferroelectric capacitor $C_{FH}$ represents a ferroelectric capacitor with polarization is "up" while a ferroelectric capacitor $C_{FL}$ represents a ferroelectric capacitor with polarization is "down", and the ferroelectric capacitor $C_{FH}$ and $C_{FL}$ are disposed in a memory array of a ferroelectric memory. The sense linear capacitor $C_L$ represents an external linear capacitor which is disposed in the exterior of the memory array and is connected in serial to a bit line BL1 (BL2) corresponded to the ferroelectric capacitor $C_{FH}$ (the ferroelectric capacitor $C_{FL}$). The symbol $V_R$ represents a read voltage.

As shown in FIG. 3A, when the polarization of the ferroelectric capacitor $C_{FH}$ is "up", a voltage value of the output voltage $V_{G1}$ can be calculated to get a value $V_{G1}=V_R \times C_L/(C_L+C_L)$ via an equation.

Figure 4:
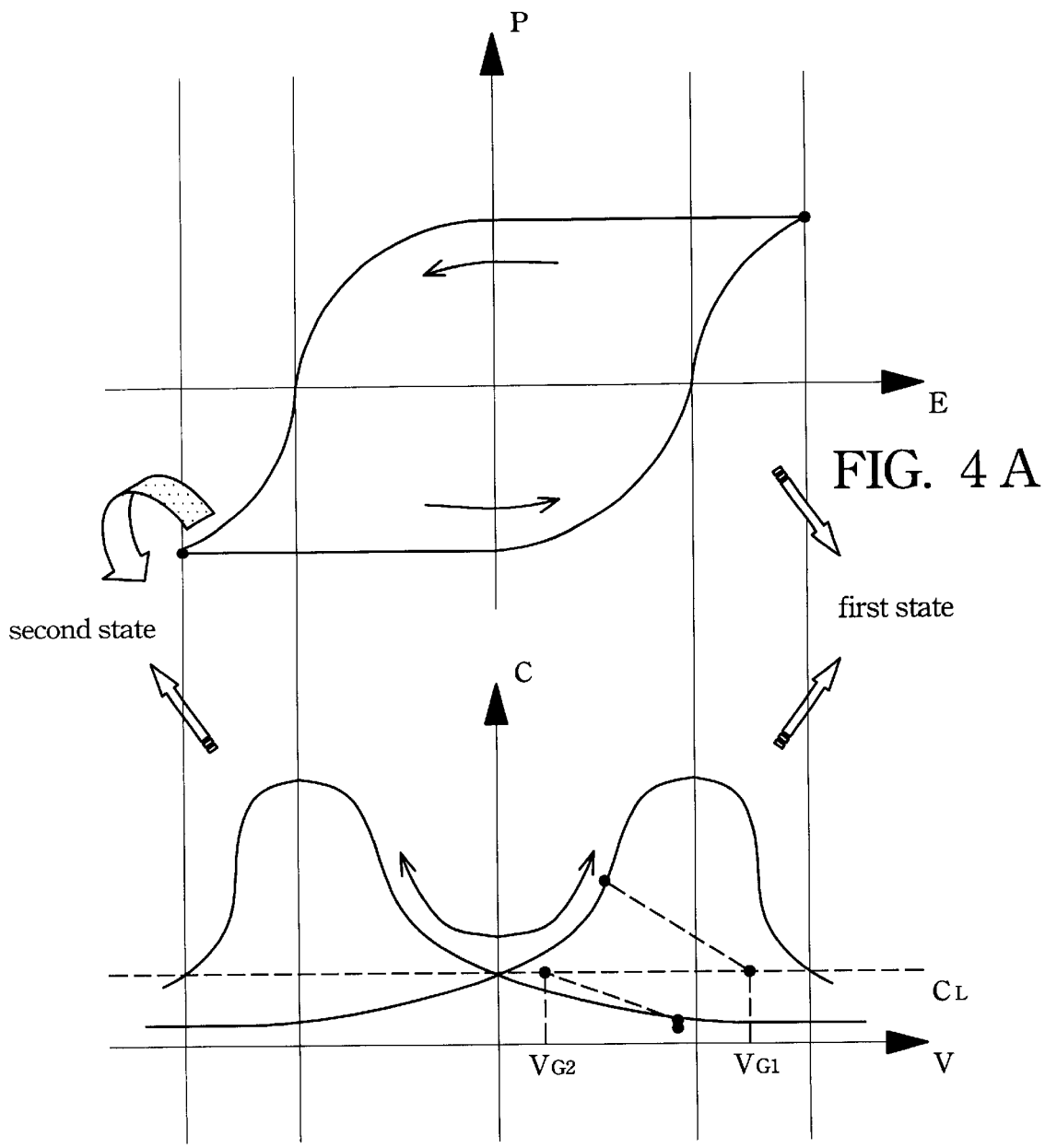
FIGS. 4A and 4B show curve diagrams of polarization-electric field (P-E) and capacitance-voltage (C-V) of a ferroelectric capacitor, respectively.

FIGS. 4A and 4B show curve diagrams of polarization-electric field (P-E) and capacitance-voltage (C-V) of a ferroelectric capacitor, respectively. Referring to FIGS. 3B, 4A and 4B, when the ferroelectric capacitor $C_{FH}$ is at a second state or its polarization is "down" while the sense linear capacitor $C_L$ is maintained at the same, and when providing a read voltage $V_R$, a value of the ferroelectric capacitor $C_{FL}$ becomes smaller in response to the enhanced read voltage $V_R$ while a value of the sense linear capacitor $C_L$ maintains in response to the enhanced read voltage $V_R$. Thus, the voltage value of the output voltage $V_{G2}$ can be calculated via an equation (b). That is, the output voltage $V_{G2}$ will be changed due to the capacitance of the ferroelectric capacitor $C_{FL}$ and the sense linear capacitor $C_L$ are different.

$$V_{G1}=V_R \times C_{FH}/(C_{FH}+C_L) \quad (a)$$

$$V_{G2}=V_R \times C_{FL}/(C_{FL}+C_L) \quad (b)$$

For example, if the output voltage is $V_R \times C_{FH}/(C_{FH}+C_L)$ and a logic state of a ferroelectric capacitor of a memory cell is "1", when the output voltage is $V_R \times C_{FL}/(C_{FL}+C_L)$, the logic state of the ferroelectric capacitor of the memory cell is "0". Therefore, we can properly decide the logic state of the ferroelectric capacitor of the memory cell via $V_{G1}$ and $V_{G2}$ calculated by equation (a) or (b).

Figure 5:
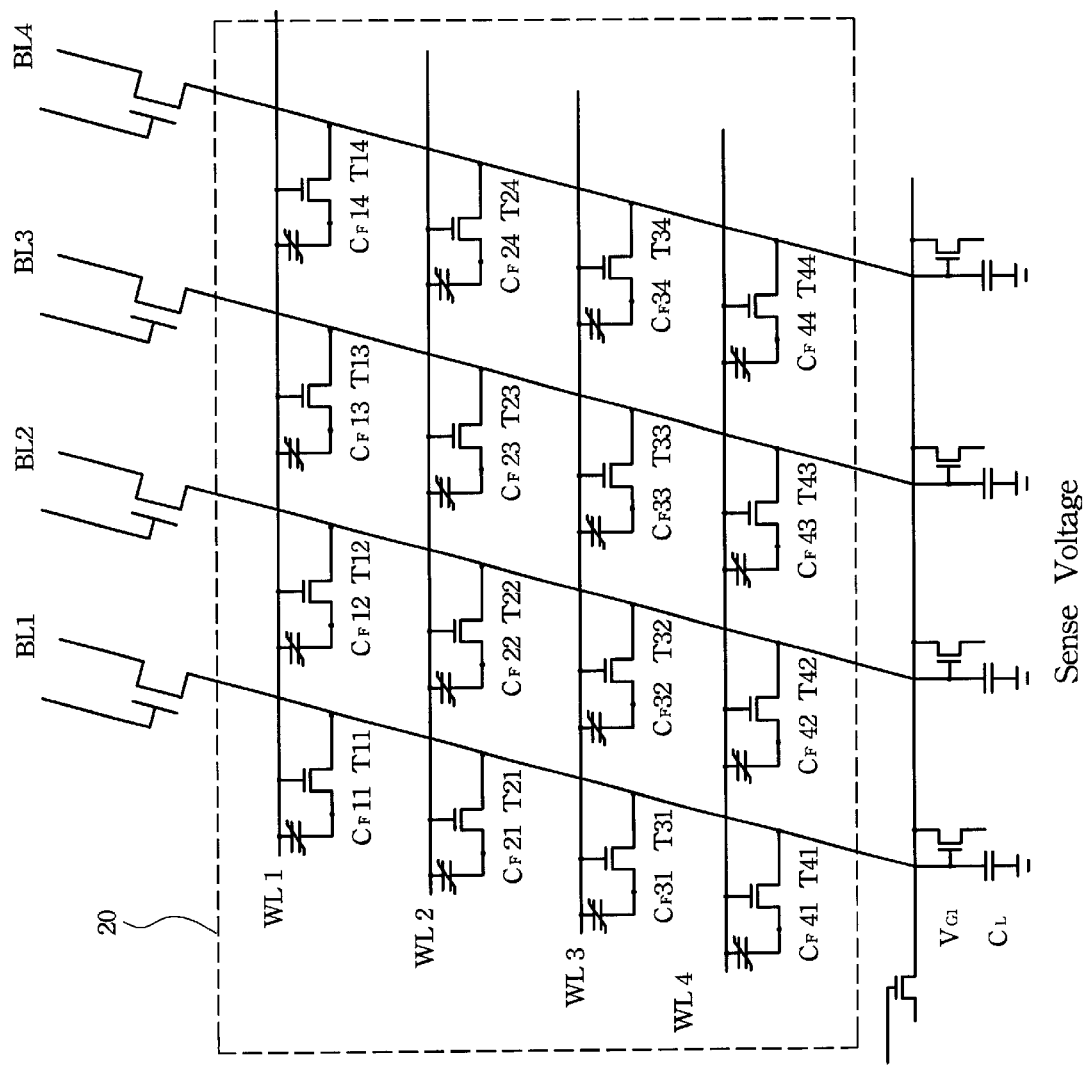
FIG. 5 shows a schematic view of a structure of detecting polarization of a ferroelectric capacitor in a ferroelectric memory by using a sense linear capacitor of a preferred embodiment according to the present invention.

FIG. 5 shows a schematic view of a structure of detecting polarization of a ferroelectric capacitor in a ferroelectric memory by using a sense linear capacitor of a preferred embodiment according to the present invention.

As shown in FIG. 5, the structure of the invention at least comprises a memory array 20 and a sense linear capacitor $C_L$. The memory array 20 consists of a plurality of memory cells. Each bit line and each word line constitute a memory cell. In the following description, the invention will be explained through a memory cell constituted by a bit line BL1 and a word line WL1 as an example.

The memory array 20 at least comprises a memory cell consists of a depletion mode NMOS transistor T11 and a cell ferroelectric capacitor $C_F11$. The depletion mode NMOS transistor T11 has a source terminal connected to a bit line BL1 and a gate terminal connected to a word line WL1. The cell ferroelectric capacitor $C_F11$ is connected in serial between a drain terminal of the depletion mode NMOS transistor T11 and the word line WL1. A sense linear capacitor $C_L$ is disposed outside the memory array 20 and is connected in serial between an output terminal of the bit line BL1 and a sense voltage.

The method for detecting a polarization of a cell ferroelectric capacitor $C_F11$ of FIG. 5 is similar to the method of FIGS. 3A and 3B. Namely, a logic state of the cell ferroelectric capacitor $C_F11$ can be decided by detecting a output voltage on a connection node $V_{G1}$ between the cell ferroelectric capacitor $C_F11$ and the linear capacitor $C_L$, thus it is not described again herein.

According to the above description, the present invention provides a method for detecting polarization of a ferroelectric capacitor in a ferroelectric memory and thereof structure, which detecting polarization of a cell ferroelectric capacitor through a characteristic which present different voltage values by providing different voltages on the cell ferroelectric capacitor stay at different polarization directions, so that the disadvantages caused by a conventional method for detecting charge quantity can be improved and a size limitation of the cell ferroelectric capacitor can be solved.

While the preferred embodiment of the invention has been illustrated and described, it will be appreciated that various changes can be made therein without departing from the spirit and scope of the invention.

What is claimed is:

1. A method for detecting polarization of a ferroelectric capacitor in a ferroelectric memory, wherein the ferroelectric memory comprises a memory array and a plurality of sense linear capacitors disposed outside the memory array, which at least comprises a memory cell constituted of a transistor and a ferroelectric capacitor, and a first terminal of the ferroelectric capacitor and a gate terminal of the transistor are connected with a word line, and a second terminal of the ferroelectric capacitor is connected with a source terminal of the transistor, and a drain terminal of the transistor is connected with a bit line, the method comprising the steps of:

providing a first voltage to the word line and a second voltage to the bit line for activating the transistor;

detecting and obtaining an output voltage by utilizing a voltage division equation on a connection node, wherein the connection node is on the bit line and between the transistor and a first sense linear capacitor of the plurality of sense linear capacitors, wherein the first sense linear capacitor is connected with the drain terminal of the transistor in serial electrically via the bit line;

if the output voltage is high level, a logic state of the memory cell is decided to a first logic state; and if the output voltage is low level, the logic state of the memory cell is decided to a second logic state.

2. The method according to claim 1, wherein when the logic state of the memory cell is the first logic state, a polarization of the ferroelectric capacitor is up.

3. The method according to claim 1, wherein when the logic state of the memory cell is the second logic state, a polarization of the ferroelectric capacitor is down.

4. The method according to claim 1, wherein when the first logic state is logic "1", the second logic state is logic "0".

5. The method according to claim 1, wherein when the first logic state is logic "0", the second logic state is logic "1".

6. The method according to claim 1, wherein the voltage division equation is the second voltage multiplied by the capacitance of the ferroelectric capacitor divided by the addition of the capacitance of the ferroelectric capacitor and the capacitance of the sense linear capacitor.

7. The method according to claim 1, wherein the transistor is a depletion mode NMOS transistor.

8. A structure of detecting polarization of a ferroelectric capacitor in a memory array of a ferroelectric memory, the structure at least comprising:

a memory cell, that is constituted of a transistor and the ferroelectric capacitor, wherein a first terminal of the ferroelectric capacitor and a gate terminal of the transistor are connected with a word line in the ferroelectric memory, and a second terminal of the ferroelectric capacitor is connected with a source terminal of the transistor, and a drain terminal of the transistor is connected with a bit line in the ferroelectric memory; and a sense linear capacitor, that is disposed outside the memory array and is connected with the drain terminal of the ferroelectric capacitor in serial electrically via the bit line.

9. The structure according to claim 8, wherein the transistor is a depletion mode NMOS transistor.

* * * * *